(12) United States Patent
Hunter

(10) Patent No.: US 7,263,450 B2
(45) Date of Patent: Aug. 28, 2007

(54) METHOD AND APPARATUS FOR READING AND CONTROLLING ELECTRIC POWER CONSUMPTION

(76) Inventor: Robert R. Hunter, 111 Deerwood Rd. #200, San Ramon, CA (US) 94583

( * ) Notice: Subject to any disclaimer, the term of this patent is extended or adjusted under 35 U.S.C. 154(b) by 644 days.

(21) Appl. No.: 10/481,611

(22) PCT Filed: Jun. 28, 2002

(86) PCT No.: PCT/US02/20961

§ 371 (c)(1),
(2), (4) Date: Dec. 19, 2003

(87) PCT Pub. No.: WO03/003029

PCT Pub. Date: Jan. 9, 2003

(65) Prior Publication Data

US 2005/0096857 A1    May 5, 2005

(51) Int. Cl.
*G06F 19/00*    (2006.01)
(52) U.S. Cl. ..................... 702/65; 324/76.11
(58) Field of Classification Search ............... 702/188, 702/182–185, 99, 64–69; 324/76.11; 705/412
See application file for complete search history.

(56) References Cited

U.S. PATENT DOCUMENTS

| | | |
|---|---|---|
| 4,132,981 A | 1/1979 | White |
| 4,216,384 A | 8/1980 | Hurley |
| 4,327,362 A | 4/1982 | Hoss |
| 4,350,980 A | 9/1982 | Ward |
| 4,390,876 A | 6/1983 | Bjorklund |

(Continued)

FOREIGN PATENT DOCUMENTS

EP    0 967 766 A2    12/1999

OTHER PUBLICATIONS

Residential energy management tool from Invensys designed to help reduce demand, need for new generation, Only the first page of this article was available for download, [online] Retrieved from the internet: <URL:http://www.Invensysnetworks.com/News/pdf/AMRReport.pdf>, Appearing on the document is the date of Mar. 14, 2002.

(Continued)

*Primary Examiner*—Edward Raymond

(57) ABSTRACT

An electro-optical, automatic meter reader for enabling a consumer to view and manage power consumption through a browser. A sensor attached to a bracket is mounted to the outside cover of a utility meter without modification of the meter or removal of its housing. A data-collector stores data obtained from the sensor via a serial port which may also provide power for the sensor, thus avoiding use of a dedicated power supply. The data-collector connects to a computer which provides a centralized object through which to view and manage power consumption. The real-time and combined historic data can be used to forecast whether usage will fall above or below a predetermined usage level at the end of a given period of time. In response to a forecast exceeding the level, the computer displays the appropriate graph in a red colored bar within a quantity vs. time chart. The computer may control power consuming devices. A communication system may be established to the system for remote management by the consumer or by the utility company for its own billing and management purposes.

21 Claims, 9 Drawing Sheets

U.S. PATENT DOCUMENTS

| | | |
|---|---|---|
| 4,463,354 A | 7/1984 | Sears |
| 4,646,084 A | 2/1987 | Burrowes et al. |
| 4,652,877 A | 3/1987 | Gray |
| 4,680,704 A | 7/1987 | Konicek et al. |
| 4,707,852 A | 11/1987 | Jahr et al. |
| 4,747,041 A | 5/1988 | Engel et al. |
| 4,758,836 A | 7/1988 | Scuilli |
| 4,782,341 A | 11/1988 | Gray |
| 4,783,623 A | 11/1988 | Edwards et al. |
| 4,792,677 A | 12/1988 | Edwards et al. |
| 4,803,632 A | 2/1989 | Frew et al. |
| 4,833,618 A | 5/1989 | Verma et al. |
| 4,881,070 A | 11/1989 | Burrowes et al. |
| 4,884,021 A | 11/1989 | Hammond et al. |
| 4,939,728 A | 7/1990 | Markkula, Jr. et al. |
| 4,987,363 A | 1/1991 | Gibbs et al. |
| 5,002,226 A | 3/1991 | Nelson |
| 5,086,385 A | 2/1992 | Launey et al. |
| 5,111,407 A | 5/1992 | Galpern |
| 5,140,351 A | 8/1992 | Garcia et al. |
| 5,214,587 A | 5/1993 | Green |
| 5,252,967 A | 10/1993 | Brennan et al. |
| 5,270,704 A | 12/1993 | Sosa Quintana et al. |
| 5,278,551 A | 1/1994 | Wakatsuki et al. |
| 5,298,894 A | 3/1994 | Cerny et al. |
| 5,333,183 A | 7/1994 | Herbert |
| 5,446,677 A | 8/1995 | Jensen et al. |
| 5,493,287 A | 2/1996 | Bane |
| 5,495,239 A | 2/1996 | Ouellette |
| 5,506,404 A | 4/1996 | Milan-Kamski |
| 5,511,188 A | 4/1996 | Pascucci et al. |
| 5,522,044 A | 5/1996 | Pascucci et al. |
| 5,523,751 A | 6/1996 | Byford et al. |
| 5,541,589 A | 7/1996 | Delaney |
| 5,550,988 A | 8/1996 | Sarangdhar et al. |
| 5,553,609 A | 9/1996 | Chen et al. |
| 5,555,195 A | 9/1996 | Jensen et al. |
| 5,559,894 A | 9/1996 | Lubliner et al. |
| 5,572,438 A | 11/1996 | Ehlers et al. |
| 5,589,764 A | 12/1996 | Lee |
| 5,602,744 A | 2/1997 | Meek et al. |
| 5,619,192 A | 4/1997 | Ayala |
| 5,669,276 A | 9/1997 | Spacek |
| 5,678,042 A | 10/1997 | Pisello et al. |
| 5,684,710 A | 11/1997 | Ehlers et al. |
| 5,684,826 A | 11/1997 | Ratner |
| 5,696,695 A | 12/1997 | Ehlers et al. |
| 5,699,276 A | 12/1997 | Roos |
| 5,721,659 A | 2/1998 | Young |
| 5,721,934 A | 2/1998 | Scheurich |
| 5,742,762 A | 4/1998 | Scholl et al. |
| 5,767,790 A | 6/1998 | Jovellana |
| 5,804,802 A | 9/1998 | Card et al. |
| 5,805,458 A | 9/1998 | McNamara et al. |
| 5,808,558 A | 9/1998 | Meek et al. |
| 5,852,658 A | 12/1998 | Knight et al. |
| 5,880,464 A | 3/1999 | Vrionis |
| 5,913,036 A | 6/1999 | Brownmiller et al. |
| 5,924,486 A | 7/1999 | Ehlers et al. |
| 5,968,176 A | 10/1999 | Nessett et al. |
| 6,012,152 A | 1/2000 | Douik et al. |
| 6,087,959 A | 7/2000 | Glorioso |
| 6,098,893 A | 8/2000 | Berglund et al. |
| 6,118,269 A | 9/2000 | Davis |
| 6,134,655 A | 10/2000 | Davis |
| 6,167,389 A | 12/2000 | Davis et al. |
| 6,178,362 B1 | 1/2001 | Woolard et al. |
| 6,181,257 B1 | 1/2001 | Meek et al. |
| 6,216,956 B1 | 4/2001 | Ehlers et al. |
| 6,226,600 B1 | 5/2001 | Rodenberg et al. |
| 6,262,672 B1 | 7/2001 | Brooksby et al. |
| 6,301,674 B1 | 10/2001 | Saito et al. |
| 6,311,105 B1 | 10/2001 | Budike, Jr. |
| 6,351,693 B1 | 2/2002 | Monie et al. |
| 6,362,745 B1 | 3/2002 | Davis |
| 6,363,422 B1 | 3/2002 | Hunter et al. |
| 6,369,719 B1 | 4/2002 | Tracy et al. |
| 6,429,642 B1 | 8/2002 | Rodilla |
| 6,476,728 B1 | 11/2002 | Sakakibara |
| 6,483,291 B1 | 11/2002 | Bhateja et al. |
| 6,542,791 B1 | 4/2003 | Perez |
| 6,574,104 B2 | 6/2003 | Patel et al. |
| 6,577,962 B1 | 6/2003 | Afshari |
| 6,618,709 B1 | 9/2003 | Sneeringer |
| 6,619,055 B1 | 9/2003 | Addy |
| 6,622,097 B2 | 9/2003 | Hunter |
| 6,636,893 B1 | 10/2003 | Fong |
| 6,639,893 B1 | 10/2003 | Chikenji et al. |
| 6,728,646 B2 | 4/2004 | Howell et al. |
| 6,747,571 B2 | 6/2004 | Fierro et al. |
| 6,772,052 B1 | 8/2004 | Amumdsen et al. |
| 6,828,695 B1 | 12/2004 | Hansen |
| 2003/0009401 A1* | 1/2003 | Ellis ............................ 705/35 |
| 2004/0024717 A1* | 2/2004 | Sneeringer ................. 705/412 |

OTHER PUBLICATIONS

Comcast, Invensys join PECO in demand-side management trial, Only the first page of this article was available for download, [online] Retrieved from the internet: <URL:http://www.energylibrary.com/file_display_freesummary.cfm?id=1177&freesummary=1&app_id=21>, Appearing on the document is the date of Sep. 2003.

R. Levy, New Principles for Demand Response Planning, EP-P6035/C3047, EPRI, Palo Alto, CA, Mar. 2002.

Gulf Power, Price Responsive Load Management, web site viewed on or about Jun. 17, 2003, actual publication date unknown, Gulf Power, Atlanta, GA. <http://www.energy.ca.gov/peakload/documents/2002-03-15_presentations/2002-03-15_gulfpower.ppt>.

* cited by examiner

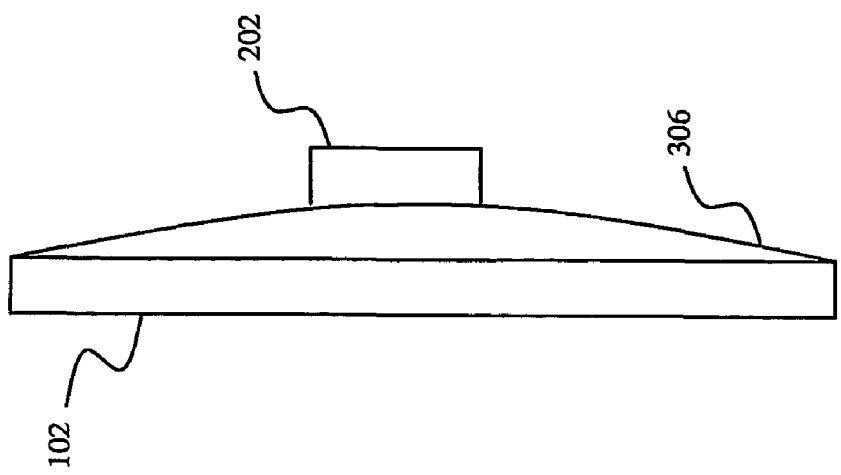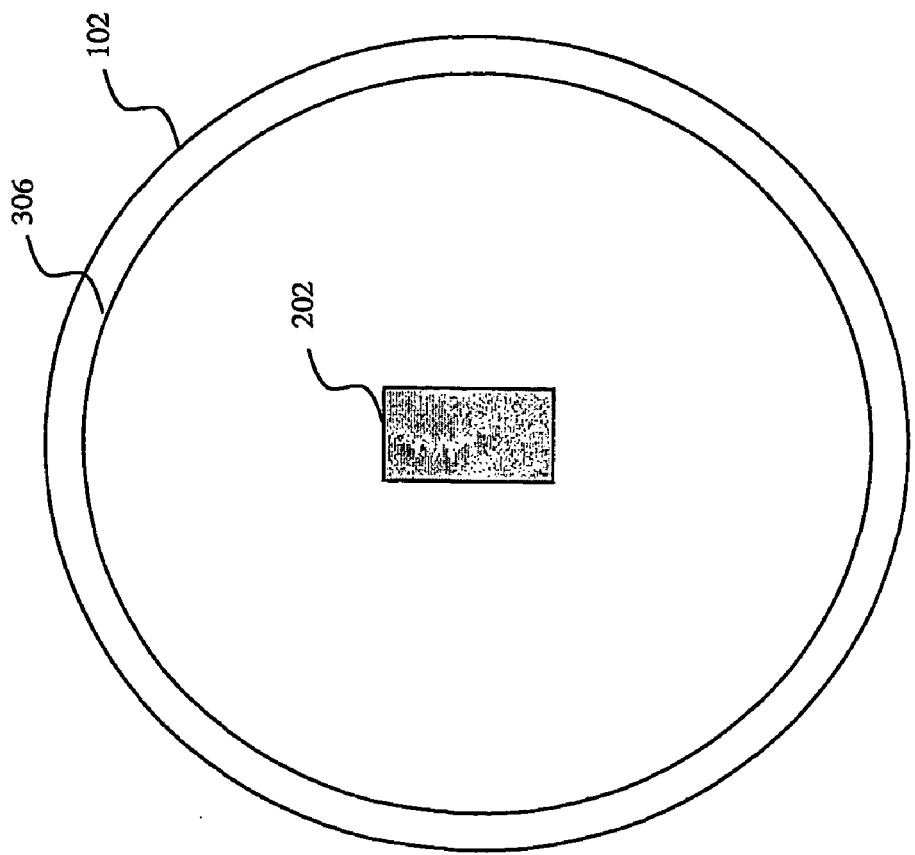

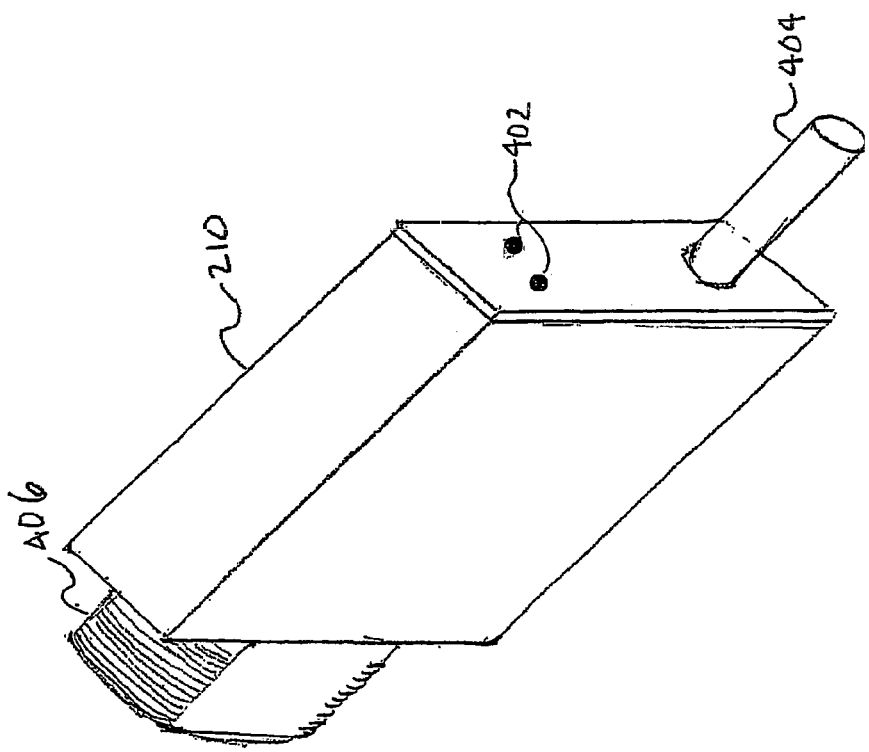

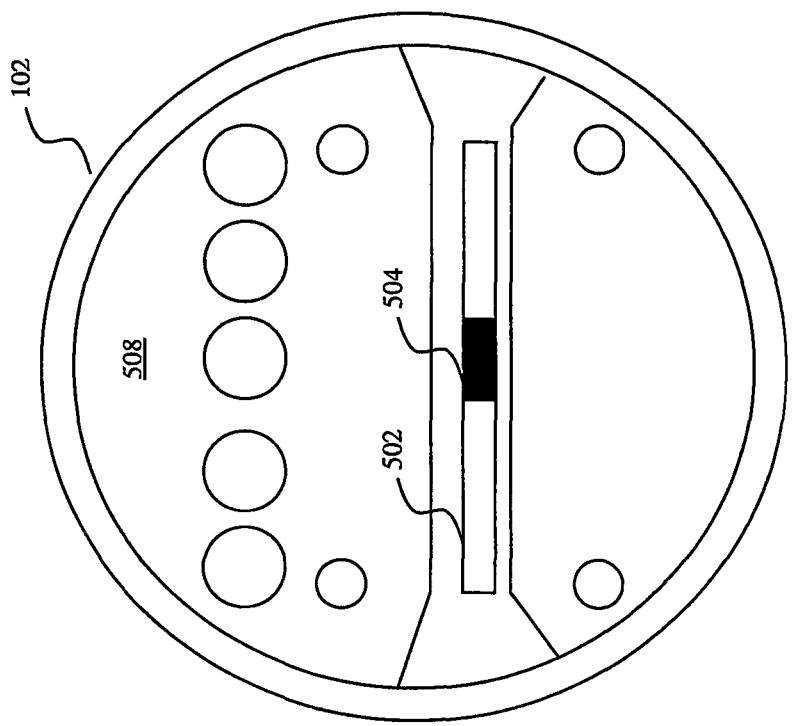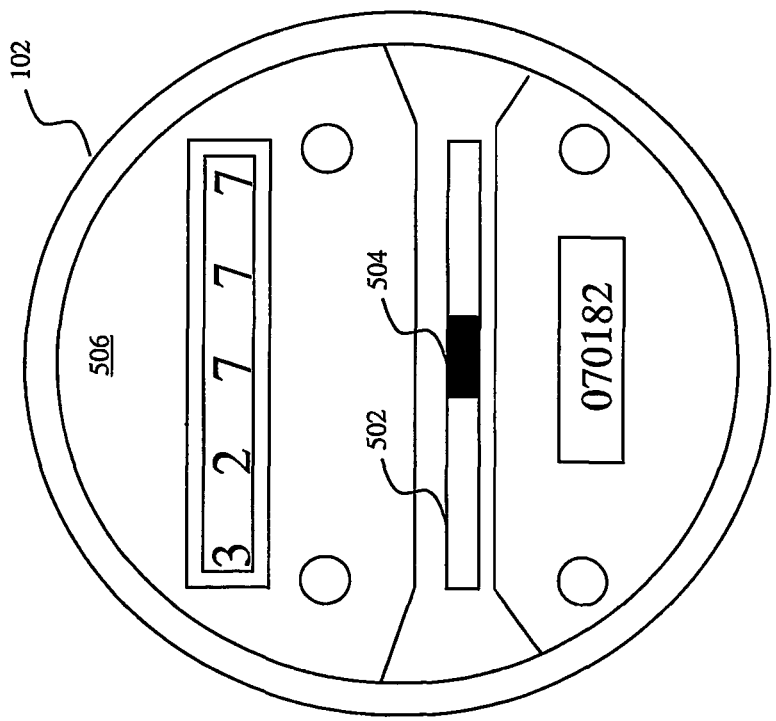
Figure 5

METHOD AND APPARATUS FOR READING AND CONTROLLING ELECTRIC POWER CONSUMPTION

This application is a national stage application of PCT International application number PCT/US02/20961 filed on Jun. 28, 2002. This application and PCT International application number PCT/US02/20961 claim priority of US patent application Ser. No. 09/896,159 filed on Jun. 28, 2001, which was issued on Sep. 16, 2003 as U.S. Pat. 6,622,097.

FIELD OF THE INVENTION

This invention relates generally to a utility usage measurement system, and more particularly to a means of obtaining real-time utility consumption readings and also managing utility consumption by controlling end-use devices from the computer or personal digital assistant (PDA) of the consumer.

BACKGROUND OF THE INVENTION

There are various types of automatic meter reading devices (AMR) which use optical light-sensing arrangements to provide remote utility readings for determining utility consumption and for billing purposes. These devices were typically developed as a cost-effective alternative to the existing meter reading methods and devices. For example, these AMR devices avoid having a person walk or drive from establishment to establishment and manually read each meter. However, the majority of methods using optical light-sensing devices are installed inside the existing meter and/or require professional installation. Thus, a skilled or trained individual must physically remove the glass housing present on such meter in order to install the automatic reading device. This process is inefficient and also very costly for either the utility company or the consumer.

In U.S. Pat. No. 5,767,790, the device utilizes a photoelectric sensor for reading the watt-hour indicator of electricity service usage. A light source beams a light on a rotating disk in the meter. The disk reflects the light except for one darkened area, which absorbs the beam of light. The reflected light is sensed by the photoelectric sensor and a pulse is sent each time the reflected light is not sensed. Each pulse indicates one full rotation of the disk. All of the computing elements of the monitor system are contained within the utility watt-hour meter housing, and even the glass cover is replaced with a polycarbonate cover. Other similar devices installed within the existing meter housing are disclosed in U.S. Pat. Nos. 4,327,3625 and 5,506,404. A significant disadvantage typical of these devices is that the installation process requires the existing meter to be physically opened and/or the optical light sensing arrangement to be assembled with professional assistance. Thus, an ordinary consumer generally cannot set up the device, and therefore consumers would have to bear installation costs.

In U.S. Pat. No. 5,880,464, infrared light sensors are used to detect the shadow of a meter pointer against a meter face to enable the meter reader to determine consumption rates. This automatic meter reader device is placed on the cover of the watt-hour meter. However, the device requires the angle and heights of the light source and sensor to be adjusted in a specific manner using a height adjustment carrier having a collar that must be tightened, which a typical customer most likely would find difficult to accurately adjust. Furthermore, no provision is made for powering the device and thus further installation problems may be created for the consumer.

There are also certain utility-based applications in which a network controller or some other headend device located in a utility company interrogates the automatic meter reading device, in order to find out the utility usage for billing purposes. Typical drawbacks that are inherent in these systems are that customers cannot see their use in real-time, cannot access this information except when a billing statement is received and, cannot see data except in the standard format chosen by the utility company.

In addition, there are various types of readers that can be utilized to manage the consumption of electrical power or fossil fuels. U.S. Pat. No. 6,167,389 allows the consumer, through the use of adapted end-use devices, to program these devices based on a pricing-tier billing system. The pricing-tier billing system sets a billing rate for power consumption based on the load levels on a power grid. A utility company may use a billing system with four-tiers: Normal Load, Medium Load, High Load, and Critical Load. Each tier has a different billing rate for power consumption with the Critical Load tier charging at the highest rate. The utility company may transmit data packets though an open network from a centralized headend to gateways at customer locations. These data packet cause the gateways to generate random startup time offsets, to control when end-use devices will be started. This is useful to protect the power grid from being loaded such that results in a blackout. However, this system does little to provide feedback to the consumer, let alone provide them with real-time data on their use and cost that allows the consumer to directly shed load voluntarily or with incentive, in order to help the utility balance its load demands. Thus, this device allows the utility company to obtain meter readouts are obtained for internal load and billing purposes only.

SUMMARY OF THE INVENTION

The present invention provides an electro-optical, automatic meter reader (AMR) for enabling a consumer to view and manage power consumption on the consumer's computer, which may be a computer or PDA. The automatic meter reader is an apparatus for optically reading a meter using a sensor that can be used to monitor electricity consumption. A sensor of the apparatus may be attached to a bracket, which may be mounted to the outside cover of the meter. An installation process of the apparatus need not require modification of the existing meter nor require removal of the housing of the existing meter. An end-user may install the automatic meter reader without special skills or tools, in fact, with no additional hardware other than those included as a part of the system.

The photoelectric sensor beams a light onto a rotating disk, visible on the face of the meter, whose surface reflects the light. A marker such as a black dot or line placed on the rotating disk absorbs the beamed light resulting in an interval where a lower level of light is being reflected. The photoelectric sensor counts these intervals, representing the number of turns the disk rotates indicating utility usage during a given time period. The apparatus connects to a data-collection unit through a first serial port. The data-collection unit stores the data from the sensor. The serial port connection may also serve to supply power for the apparatus through one otherwise unused pin of that serial connector being assigned as a power carrier, thus avoiding the need for a dedicated power supply. The data collection unit may also be used to store data when the computer is turned off and can be powered by an external 12 volt DC power supply.

The data-collection unit connects through a second serial port, located on the opposite side from the first serial port, to the user's computer. The computer provides the consumer with a centralized location to either directly or remotely view and manage his power consumption. The software collects the data and provides the end-user with information relating to power consumption such as real-time rate of usage and historical usage levels. For example, information is arranged in three graphs that are analogous to information common to automobile travel. These include the real-time rate-of-use, comparable to the speedometer of an automobile. This graph tells the user how much power they are consuming at this moment. The second graph, a monthly data graph displaying daily data, is comparable to the trip odometer. This graph shows the user how much power they have consumed on a day-to-date, daily and month-to-date basis. The final graph is comparable to the general odometer. It shows the total energy consumption through the life of the system. Each graph can be displayed in units of kilowatt hours or dollars or other forms of currency. By presenting this data in three logical and understandable formats, data can be used to forecast whether the consumer will be under his monthly baseline utility usage or cost level of consumption based on then-current requirements. Such forecasts are commonly used by trip computers in automobiles to tell the consumer whether they should adjust their speed to reduce fuel consumption, when they will arrive at their destination based upon present and average speed, and how many miles they have to go to complete their trip. If the power forecast indicates that the present usage will cause that consumer to exceed the baseline unit or cost level, the consumer may control the power usage of end-use devices from the computer to assure that they end the time below this requirement, especially during power crisis situations. A forecast rate for use is shown for the consumer as a red colored line on each graph. A second line, the rate of consumption that must be averaged in order to arrive at or under the base line, is also displayed on each graph. If a consumer is averaging under their baseline amount, for the period in question, the bar for that particular graph shall show as a green bar. If the consumer is averaging over the baseline amount for the period in question, the bar for that particular graph shall show as a red bar. For example, if the consumer is averaging a rate of consumption use on a daily basis that will exceed the monthly baseline level if continued for the rest of the cycle, the monthly bar shall show as red. If the consumer is averaging a rate of consumption on an hourly basis that will exceed the average daily baseline, that day's bar shall show as red in color. In this way the consumer is always aware of their status to achieve baseline levels for the hour, day, and month.

Further, the consumer may program the computer to automatically control the rate of power consumption. Through commonly available products that accept commands to control thermostats, lighting and other household items, consumer may alert such products through automatic commands to adjust the thermostat on his air conditioning unit from his computer or program the computer to automatically adjust the temperature setting on the thermostat in response to the forecast. In addition, a communication system, such as the Internet, can also be utilized to allow the computer to communicate to the utility company for billing purposes or to allow the consumer to access and manage his power consumption from a remote computer or PDA.

BRIEF DESCRIPTION OF THE DRAWINGS

The present invention will now be described in more detail with reference to preferred embodiments of the invention, given only by way of example and illustrated in the accompanying drawings in which:

FIG. 3A depict the bracket attached to a conventional meter in a front view;

FIG. 3B depict the bracket attached to a conventional meter in a side view;

FIG. 4 is an illustration of a preferred sensor;

FIG. 5 provides an illustration of conventional utility meters;

DETAILED DESCRIPTION

Figure 1:
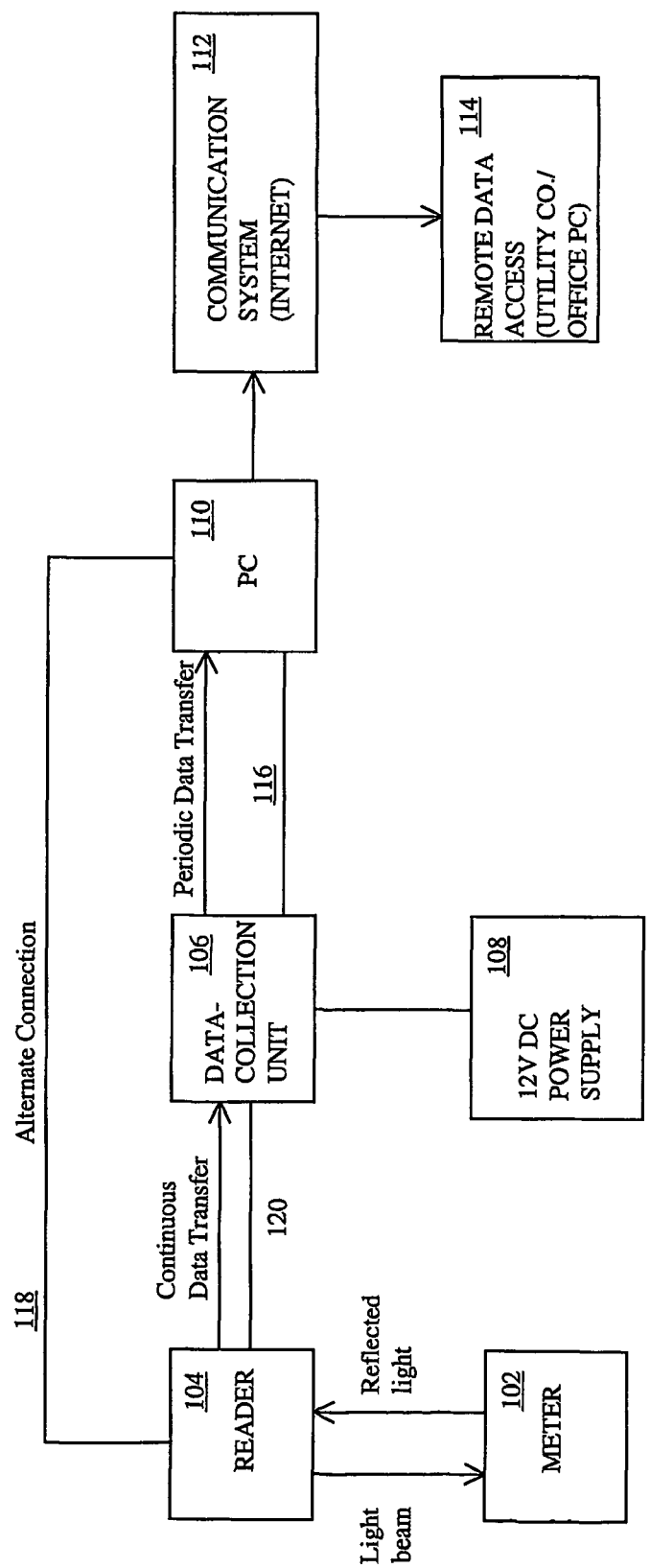
FIG. 1 illustrates a block schematic diagram of an apparatus for reading and managing power consumption in accordance with the present invention.

FIG. 1 illustrates a block schematic diagram of an apparatus 100 for reading and managing power consumption in accordance with the present invention. As shown in FIG. 1, a reader 104 is attached to a typical utility meter 102 such as an analog or digital power meter commonly found on homes, apartment buildings and commercial buildings. The reader 104 provides a means for automatically reading power consumption and may eliminate the need for manually reading the meter 102. The data generated by the reader 104 may be continuously transferred through a connection such as a serial cable 120, to a data collection unit 106 or alternatively directly to the monitoring device 110, such as a computer.

The data collector 106 is therefore optional. When provided, the data collection unit stores data generated by the reader 104. The data collection unit 106 may store data for a limited time when the monitoring device (computer) 110 is shut off or in the event of a power failure. With appropriate memory, the unit 106 may be able to store data for up to a year. The preferred embodiment of the data-collection unit 106 for a household may include a single serial port interface from the reader 104, such as a RJ-11 or RJ45 and a single serial port out, to the computer 110, such as a DB-9. The preferred data-collection unit 106 is approximately 2" wide and 3" long and includes a 12 volt input, such as from a wall mounted AC to DC converter 108. A battery, such as a standard watch battery, may be provided for backup. Further, the data collection unit 106 may be powered by the serial driver of one pin on the serial port of the computer. The preferred data-collection unit 106 includes a microprocessor such as a PIK Microprocessor including non-volatile memory and a timer crystal. It will be apparent that any microprocessor or controller could be used.

In a preferred application of the invention where multiple power meters are monitored, such as an apartment building or a commercial building, may be similar to the household application described above. However, the data collection unit 106 may be provided with inputs for additional readers 104, such as four to eight inputs and an optional Ethernet connector for networking to a single monitoring device 110.

The preferred embodiment of the monitoring device 110 may be a conventional general-purpose computer system or a serial server containing one or more serial ports and an Ethernet port, and need not be specific to this application. The monitoring device 110 receives the data from a cable 118, such a serial cable, which connects directly to the reader 104. Alternatively, a cable 116 may be a serial cable connecting to the optional data-collection unit 106 through a serial port in, such as a RJ-45 or RJ-11 connector and a serial port out, such as a DB-9 connector. The monitoring device 110 will not lose information during power failure as it stored its data in non-volatile memory and real-time data is only gathered when power is present and being consumed. In addition, when employed, the data collector 106 will not lose its data during an outage because it holds historic values in non-volatile memory and real-time data is only gathered when power is present and, thus, being consumed.

The monitoring device 110 may be connected to a communication system 112 or network, such as the Internet to allow remote access 114 of the data. For example, a utility company may obtain the data for billing purposes or by the end-user who wants to control his power consumption from his PDA or computer from a remote location, such as his office.

Figure 2B:
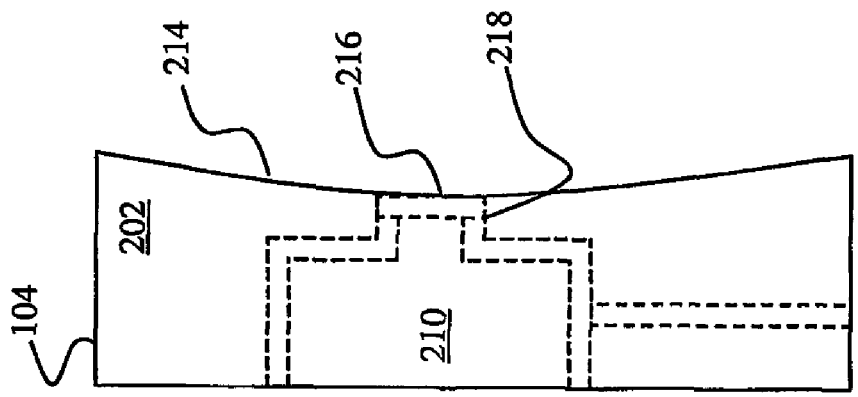
FIG. 2B provides an illustrated embodiment of the reader in a side sectional view.
Figure 2A:
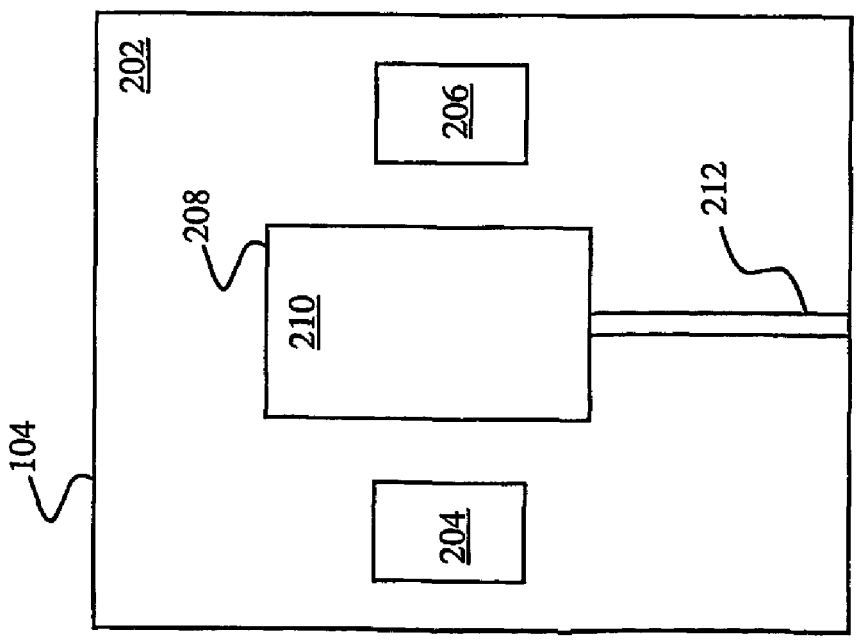
FIG. 2A provides an illustrated embodiment of the reader in a plan view.

FIGS. 2A and 2B provides an illustrated embodiment of the reader 104 in both a plan view (FIG. 2A) and a side sectional view (FIG. 2B). The reader 104 includes a bracket 202 and a sensor 210 such as a photoelectric sensor. The bracket 202 preferably is a unitary body and lacks movable parts thus being relatively cost effective and also being easy to install. The preferred material for the bracket 202 is either rubber or plastic but it may be made out of any suitable material. Included in the bracket 202 may be an aperture 208 for accepting the sensor 210. The sensor 210 may be threaded into a nut 216 attached to the meter 102. For example, the nut 216 may be plastic and secured using glue or epoxy to the meter face. The nut 216 may fit into a recessed portion 218 of the bracket 202. In addition, a heat and moisture dissipation channel 212 may be included to allow ventilation of the heat generated by the sensor 210. The heat generated from the sensor 210 may be used to melt ice in cold-weather climates in which case melted ice may escape through the channel 212. In addition, the channel 212 acts as a temperature equalization path between the sensor 210 and the outside elements, thus preventing the fogging of the lens in the sensor aperture 406. The bracket 202 may also incorporate a fastener 204 and 206, for example a hook and loop such as Velcro or double-sided tape or other adhesive to attach to the meter 102. As illustrated in FIG. 2B, the back of the bracket 202 may follow the same contour as the meter 102 to ensure proper alignment and secure mounting to the meter.

FIGS. 3A and 3B depict the bracket 202 attached to a conventional meter 102 in both a front view (FIG. 3A) and also a side view (FIG. 3B). The bracket 202 may attach to the translucent (typically glass), outside cover 306 of the meter 102 conventional to most existing electric utility meters. As mentioned above, the shape 214 of the bracket 202 may follow the same contour as the translucent outside cover 306 of the existing meter 102 ensuring proper alignment with the existing meter 102. An installation process of the bracket 202 to the translucent outside cover 306 of the existing meter 102 need not require modification of the existing meter 102 nor removal of the translucent outside cover 306. Furthermore, the installation may only require one part of the bracket 202 to be rigidly attached to the translucent outside cover 306 allowing an end-user to install the reader 102 without special skills or tools.

FIG. 4 is an illustration of a preferred sensor. The reader 104, in a preferred embodiment, utilizes a photoelectric sensor 210 such as the Mini-Beam 2 from the Banner Engineering Corp. of Minneapolis, Minn. to read the existing meter. The sensor 210 includes a light source and a photo receptive element. The preferred size of the sensor 210 is about a 1" square but is not limited to that size. The preferred sensor also includes a threaded member 406 which may be screwed into a nut 216 secured to the meter housing 306 as mentioned above. The nut 218 may also secure the sensor 210 to the bracket 202 as shown in FIG. 2B. For example, the nut 216 may fit into a recessed portion 218 of the bracket 202. A light emitting diode (LED) 402 may be placed on the back of the sensor 210 to provide a visual indication that the sensor 210 is picking up the correct signal such as to aid in installation of the reader 104. The sensor 210 may incorporate a cable 404, such as a serial cable, that supplies the power preferably with 10V or 12 V but may range from 10–30V. The cable 404 may also provide the means for transferring data.

FIG. 5 provides an illustration of conventional utility meters 102 such as a digital meter 506 and an analog meter 508. The sensor 210 (FIG. 4) is oriented to beam a light, such as a visible red 660 nm, or another wavelength, onto a rotating disk 502 located in the meter 102. The beam of light passes through the translucent outside cover 306 of the meter 102. The surface of the disk 502 reflects the light; the reflected light is sensed by the photo receptive element of the sensor 210. A marker 504, such as a darkened area, normally found on the rotating disk 502 absorbs the beamed light resulting in an interval where a lower level of light is being reflected to the sensor 210. The number of intervals, counted by the sensor 210, represents the number of turns the disk rotates indicating utility usage during a given time period. The time between each interval is inversely proportional to the rate of power consumed. Further, the aforementioned LED 402 may turn on to indicate whether the sensor 210 has made contact with the rotating disk 502 and turn off when the black marker 504 is being sensed, thus a consumer with no special skills, will be sure of the proper alignment of the sensor 210.

The reader 104 may use software algorithms to avoid spurious data in which light sensors are vulnerable to such as may be caused by sunlight striking the rotating disk 502. The rotating disk 502 in a meter 102, may have a maximum number of rotations per second and the reader 104 may be programmed to ignore certain detections. For example, if a sensor detects more then 2 passes per second from a rotating disk 502 with a 2 rotations per second maximum, the reader 104 may be programmed to ignore the second pass. The reader 104 also may have the capability to alert the end user that an adjustment may need to be made to the sensor 210.

The reader 210 may also use a software algorithm that avoids spurious data based on the time interval between each pass. For example, if a long-short-long pattern of the intervals between passes is sensed by the reader 210 may be programmed to ignore the middle short reading. Again, an alert signal may be sent to the end user that an adjustment may need to be made to the sensor 210.

Figure 6:
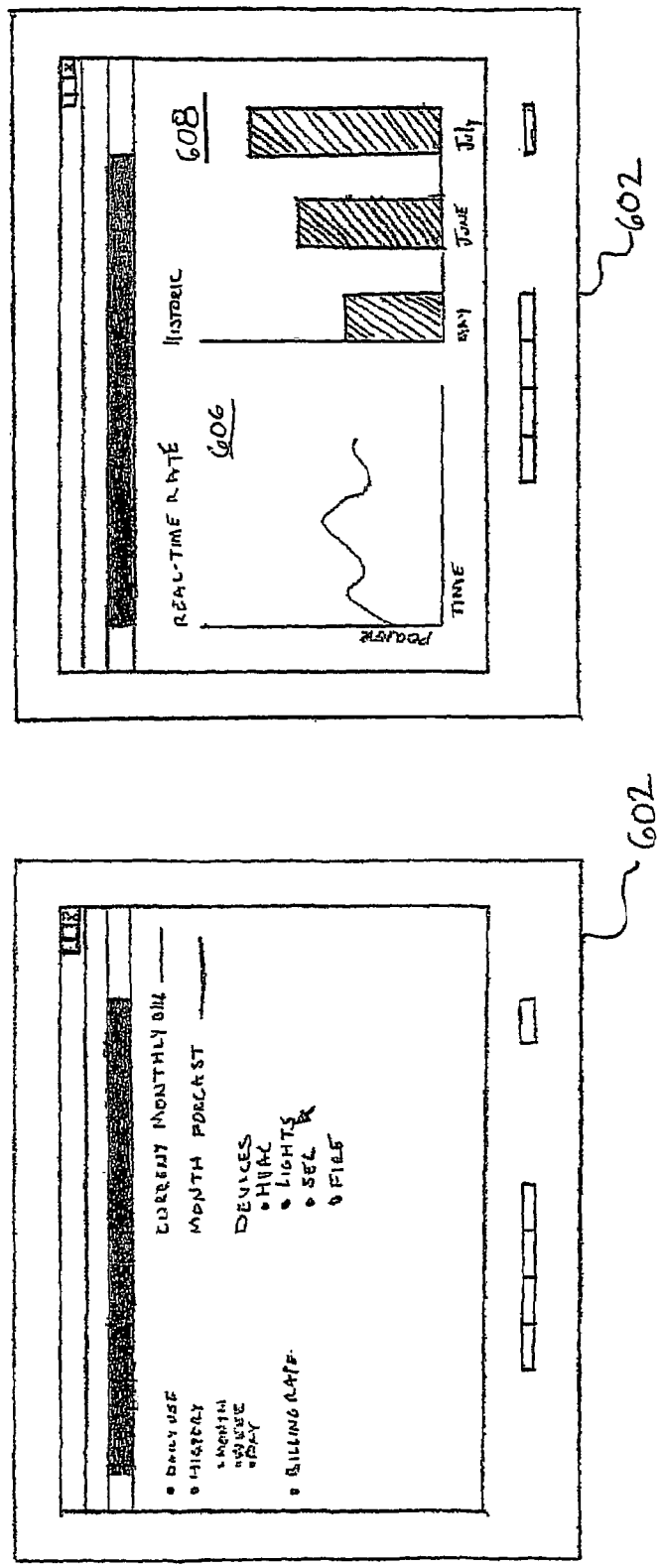
FIG. 6 illustrates a user interface displayed on the screen of the computer.

FIG. 6 illustrates a user interface displayed on the screen of the computer 110 (FIG. 1). As Illustrated in FIG. 6, the computer 110 may provide a central location for the end-user to remotely connect to or use directly to view the data collected by the reader 104. Software stored in the computer 110 memory causes the computer 110 to compile counted intervals from the reader. The software may be compliant to all automatic meter reading devices, and therefore might not be specific to the aforementioned reader 104. In addition, the software may incorporate an adjustable architecture to optimize for various sizes and complexities fitting to the end-user's need.

An interface 602 such as web-based interface (e.g. a browser), allows the end-user to monitor the information relating to power consumption. The interface 602 may, for example, render all graphic data as line or bar graphs 608 using Macromedia Corporation's Flash program. By choosing to render data via flash, the vast majority of the program overhead for rendering the interface 602 is handled directly in the browser of the computer used to display the interface 602. Thus, the computer 110 may be an inexpensive device such as a serial server or other device which contains one or more serial ports. Because an end user might want to view monthly bar graphs 608 of power consumption, Macromedia Flash provides the ability to present real-time moving graphs or pictures. This might be utilized when providing real-time power consumption rate 606 such as a line graph or chart depicting power usage over time or up-to-date/cost per billing cycle costs. In addition the interface 602 may be provide other data such as peak demand rate including date and time of the peak demand. The interface 602 is structured in automobile-familiar methods for ease of use and so that an end-user need not require special training or skills to use.

Figure 7:
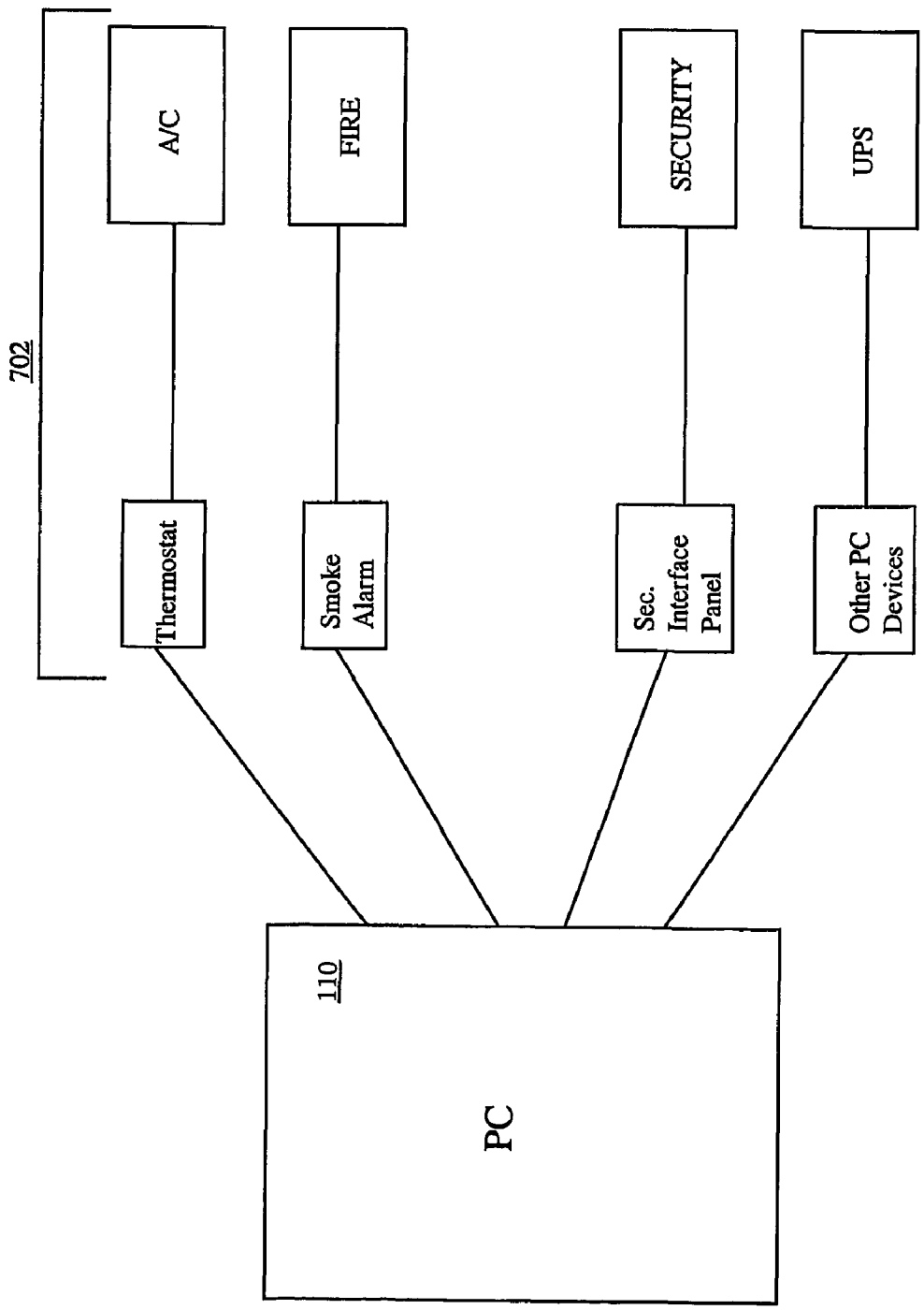
FIG. 7 is an illustration of the computer connected to power consuming device through a serial port or Ethernet interface of the computer.

Illustrated in FIG. 7 are devices 702 such as Heating Ventilation Air Condition (HVAC) systems and other power consuming devices that may be connected to the computer 110 through a serial port or Ethernet interface of the computer 110. The interface 602 may provide the end-user with information on what devices are being currently used, the rate of power consumption the device operates at, and the ability to control these devices based on measured consumption. Therefore, allowing the end-user to manage the rate of consumption for that household.

The ability to manage the rate of consumption may be especially advantageous when dealing with utility companies that use a penalty-level billing system. In this system, if a customer exceeds a predetermined level of power consumption or baseline level, then the utility company may charge a premium rate for the power consumed above the baseline. Some utility companies may also provide rebates on future bills when a customer falls below a predetermined level of usage for a given period. The interface 602 may provide a forecast based on a real-time rate of consumption to determine whether the end-user will be under his monthly baseline utility usage level of consumption or other predetermined level. The forecast may be computed by taking the average power consumption used per day of the current billing cycle and multiplying it by the number of days in a billing cycle. So, for example, if the customer was on day 5, the forecast will divide the total power usage at that time by 5 to compute a daily average and then multiply the daily average by the number of days in the billing cycle. A new forecast may be computed continuously based upon present and historical usage. If the forecast indicates that the usage will exceed the baseline level the consumer may control the power usage of end-use devices from the computer 110 to fall below this requirement, especially during power crisis situations. For example, the end-user may turn off unnecessary lights or decrease the length of time certain devices will run such as a dryer or a HVAC system from the computer 110.

Further, the consumer may program the computer 110 to automatically manage the rate of power consumption. For example, if the forecast is indicating that the consumer will exceed the baseline level if continued for the entire billing cycle, the end-user might program the computer 110 to automatically raise or lower the temperature on the thermostat a few degrees. This may provide the end-user with the consumption rate of each device and plan use of certain devices accordingly. This may be useful in setting up exact budgets and strictly adhering to them in an automated manner using the computer 110.

In addition to avoid being charged a premium rate for power consumption, the forecast can allow the end user to fully utilize all of the non-premium power allocated to him. For example, rather then shutting off the HVAC system and enduring an uncomfortable climate, the end user can use the forecast to determine a adjust the thermostat at a certain temperature the forecast may allow the end user to adjust the temperature so that he can stay under the baseline and yet enjoy in a comfortable temperature.

Using the interface 602 provided by the software stored on the computer 110, the end-user may also determine an optimization schedule for running the devices 702. The end-user may obtain data such as cost per hour device used or cost/cycle (washing machine). This may help determine whether the device is properly running as efficient as intended by the manufacturer. Also based on this information, the end-user may program or choose from created device-operating schedules to maximize cost effectiveness and power conservation.

In addition to monitoring and controlling of power-consuming devices, the monitoring device 110 may perform other control functions. For example home security systems and fire alarm systems may be connected. The end-user may control these devices through the interface and program the monitoring device to treat to signals sent by these systems.

Figure 8:
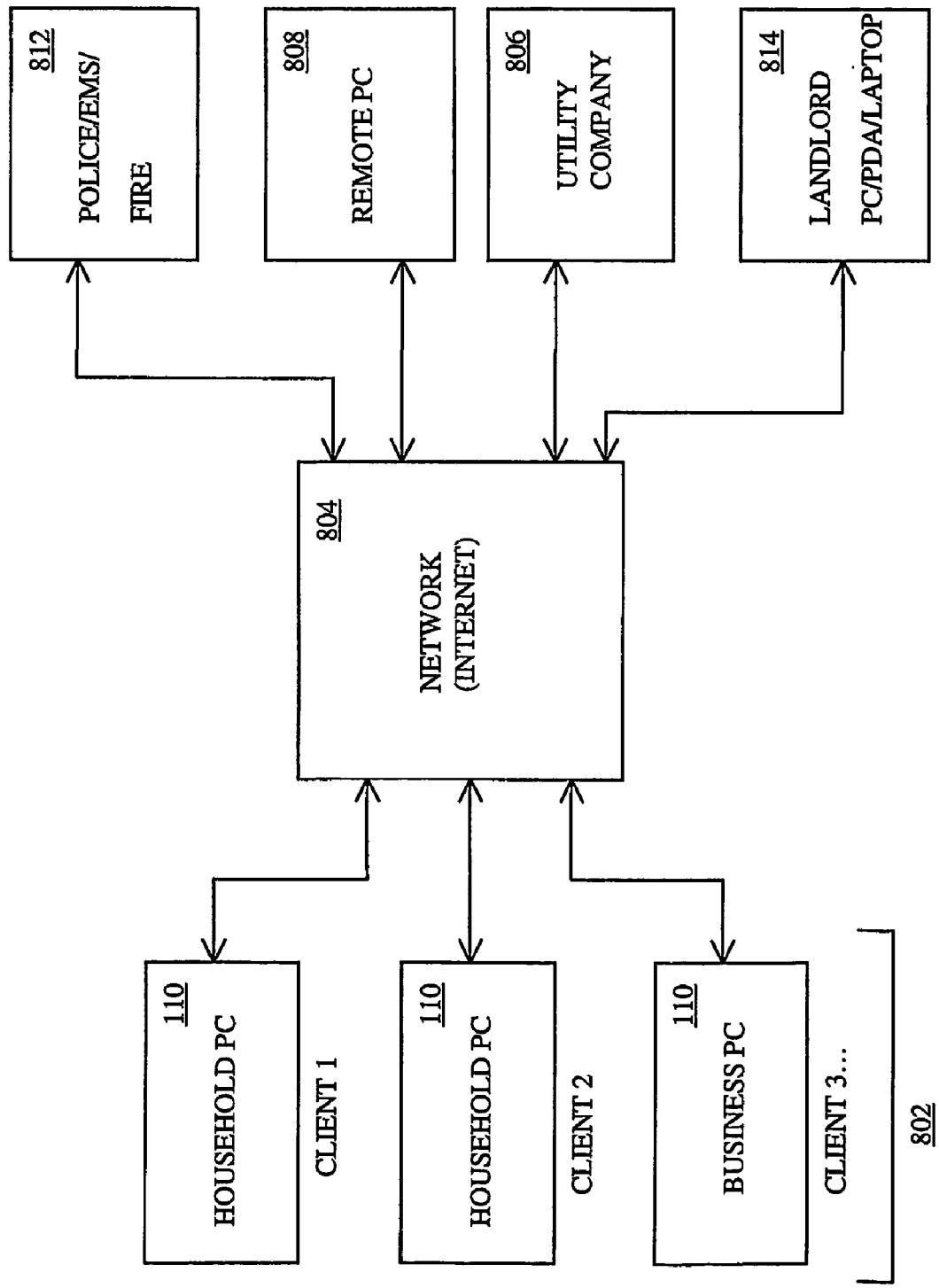
FIG. 8 provides an illustration of the computer connected to a communication system for remote access to the data stored and compiled on the computer.

Illustrated in FIG. 8, the computer 110 may be connected to a communication system 804, such as the Internet. This may allow remote access to the data stored and compiled on the computer 110. By allowing remote access to the data on the computer 110, the end-user may control power consuming devices and other devices from any location such as a computer at work 808 or from his PDA 810. For example, the end-user may want to raise or lower the temperature of his house before coming home.

There may be situations when the end-user wants to make sure that no power is being consumed, when the end-user is on vacation or business trip or when a house or baby sitter is at the premises, for instance. Remote access to power consumption information may provide the end-user with information on whether power is being consumed, at what rate it is being consumed, what device is consuming the power and the ability to control that device.

The utility company 806 may also communicate with the computer 110 to obtain the data for billing purposes. The utility company 806 may download the monthly power consumption information from the Internet and bill the end-user accordingly. In addition the utility company 806 may set up an on-line billing service and thus cut down on costs incurred in mailing the bill. Further, this may allow utility company 806 to forecast when more power is going to be consumed each day and to send emergency alerts to households or apartment/office buildings to control the power usage during a crisis situation.

Remote access to the data may provide landlords of apartment/commercial buildings with readily available utility cost information. Landlords can provide potential lessees current and historic monthly averages of utility bills from their PDA/computer/laptop 814. Also, landlords live in locations far from the property they own, possibly in a different state. Also the landlord may use the data to determine at what rate each tenant is consuming power and can adjust their rent or utility charges accordingly.

By having remote access to control power-consuming devices, the landlord or utility company might regulate the rate of power consumption while not physically going there. For example, the landlord may control the temperature of the common area of the building from his home computer 814 or even programming the lights to turn off at certain times during the day when sunlight is adequate. The utility company 806 may turn off certain devices such as HVAC systems when the power-grid is approaching maximum capacity.

Figure 9:
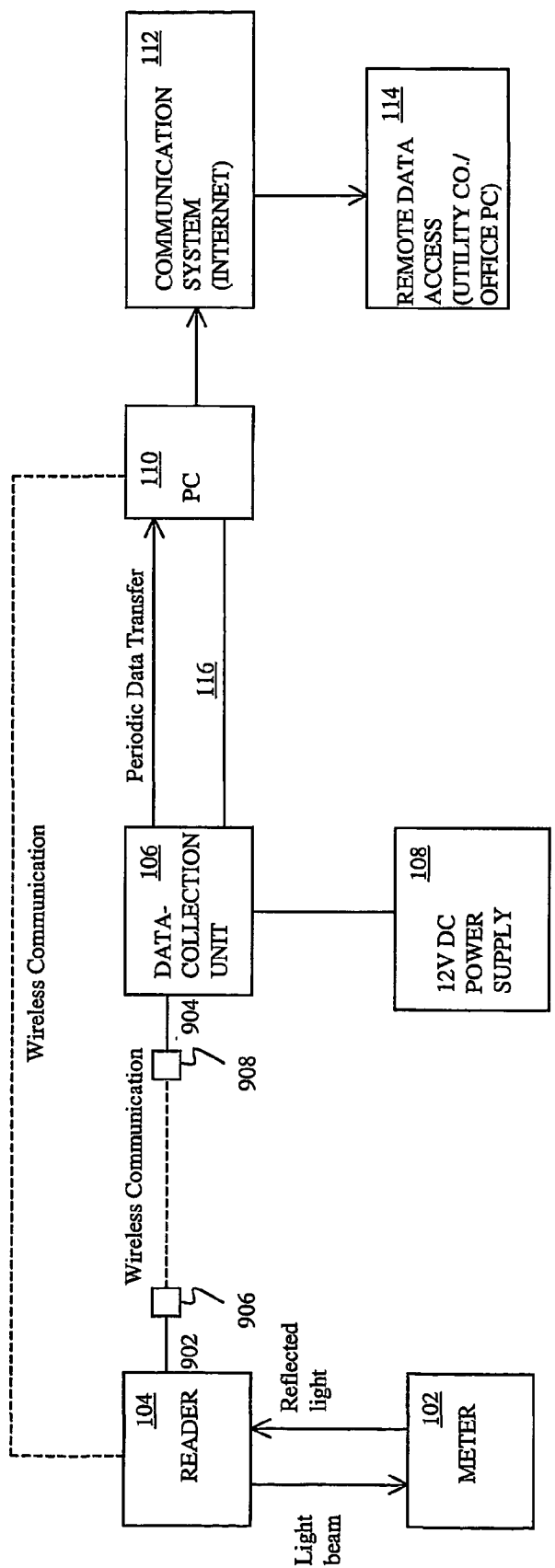
FIG. 9 illustrates an alternative embodiment of the present invention using wireless communication to transmit the data obtained by the reader.

FIG. 9 illustrates an alternative embodiment of the present invention. Unless specifically stated, all elements, of FIG. 9 have a one-to-one functional correspondence with those of FIG. 1. FIG. 9 differs form FIG. 1 in that the serial cable 120 (from FIG. 1) that connects the reader 104 and the data-collection unit 106 is replaced with a wireless communication channel. A transmitter 906 for sending wireless communications may be attached to the reader 104 using a shorter serial cable. A receiver 908 may be attached via another shorter serial cable to the data-collection unit 106 for accepting the transmitted communications from the transmitter 906. The transmitter 906 may send data via a wireless carrier frequency, such as 433 MHz, which is standard for garage door openers. It will be apparent, however that another frequency (e.g., 900 MHz) could be used. The signals sent via the transmitter 906, may be in the format of pulses that are created directly from the intervals of lower levels of reflected light sensed by the sensor 210. Thus, each pulse formed by the reader may result in a pulse at the carrier frequency communicated by the transmitter 906. To communicate the pulse to the data-collection unit 106, the transmitter 906 may send a burst of the carrier frequency to represent each revolution of the rotating disk 502. The wireless signal from the transmitter 906 may be encoded with identification information placed on the carrier frequency to prevent interference from other sources. It will be apparent that a number of different schemes may be used for communicating the revolution of the rotating disk 502 via the transmitter 906 and receiver 908. The transmitter 906 and the receiver 908 may receive operating power from a battery or a wall-mounted AC to DC converter.

Similarly to the embodiment of FIG. 1, the reader 104 may communicate directly with the computer 110. In which case, the receiver and cable 904 may be mounted to the computer 110 rather than the data collection unit 106. In addition, the data collection unit 106 may be omitted.

Wireless communication may be used to help eliminate routing problems when using serial cables such as length of the cable needed and outdoor to indoor routing. The wireless communication device would also be helpful for small businesses in which there are multiple readers which all have to be connected to a monitoring device 110.

While the foregoing has been with reference to particular embodiments of the invention, it will be appreciated by those skilled in the art that changes in these embodiments may be made without departing from the principles and spirit of the invention, the scope of which is defined by the appended claims.

What is claimed is:

1. A system for monitoring and controlling power consumption comprising: a predetermined level of power consumption; and at least one power consuming device and; a reader for obtaining power consumption data from the power consuming device; and a computer system for providing information on what devices are presently consuming power, the rate of power that is being consumed by each device and, the ability to control the power consumption of each device wherein the computer system is used to forecast the rate of power consumption of each device and to automatically manage each device in such a manner that the predetermined level of power consumption is attained, wherein the optimization schedule is prepared from operating parameters as provided by the manufacturer.

2. The system according to claim 1 wherein the computer system is used to manually manage the rate of power consumption.

3. The system according to claim 1 where the computer system is used to automatically manage the rate of power consumption.

4. The system according to claim 1 wherein the predetermined level of power consumption is set to allow for the full utilization of non-premium power.

5. The system according to claim 1 wherein the control of power consuming devices may be effected remotely.

6. The system according to claim 5 wherein the remote communication is via the Internet.

7. The system according to claim 5 wherein the local communication is via wireless means.

8. The system according to claim 5 wherein the remote communication is via wireless means.

9. A method for monitoring and controlling power consumption comprising: choosing a predetermined level of power consumption; and using at least one power consuming device; and reading power consumption data from an automatic reader to obtain power consumption data from at least one power consuming device; and determining which devices are presently consuming power, the rate of power that is being consumed by each device and, the ability to control the power consumption for each device using a computer system wherein the computer system is used to forecast the rate of power consumption of each device and to manage each device in such a manner that the predetermined level of power consumption is attained, wherein the predetermined level of power consumption is prepared from operating parameters as provided by the manufacturer.

10. The method according to claim 9 wherein the computer system is used to manually manage the rate of power consumption.

11. The method according to claim 9 where the computer system is used to automatically manage the rate of power consumption.

12. The method according to claim 9 wherein the predetermined level of power consumption is set to allow for the full utilization of non-premium power.

13. The method according to claim 9 wherein the control of power consuming devices may be effected remotely.

14. The method according to claim 13 wherein the remote communication is via the Internet.

15. The method according to claim 13 wherein the local communication is via wireless means.

16. The method according to claim 13 wherein the remote communication is via wireless means.

17. A system for optimizing the utilization of power consuming devices comprising: at least one power consuming device; a predetermined rate of power consumption based on an optimization schedule; a reader for obtaining power consumption data from the power consuming device; and a computer system that is used in the control of the one or more power consuming devices in such a manner in which the devices are controlled to achieve the expected optimized level of power consumption, wherein the optimization schedule is prepared from operating parameters as provided by the manufacturer.

18. The system according to claim 17, wherein the optimization schedule is used to create an optimized level of power consumption that is maximized for the purposes of minimizing cost for the, at least one, device.

19. The device according to claim 18, wherein the device is an air conditioning unit.

20. The device according to claim 18, wherein the device is supported by a UPS unit.

21. The system according to claim 17, wherein the optimization schedule is used to create an optimized level of power consumption that is minimized for the purpose of power conservation for the, at least one, device.

* * * * *